United States Patent
Lee et al.

(10) Patent No.: US 6,246,584 B1
(45) Date of Patent: Jun. 12, 2001

(54) HEAT SINK

(75) Inventors: Hsieh-Kun Lee, Chung-Ho; Shun-Jung Lee, Pan-Chiao, both of (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 09/293,193

(22) Filed: Apr. 16, 1999

(51) Int. Cl.⁷ ........................................ H05K 7/20
(52) U.S. Cl. .................... 361/704; 24/458; 248/510; 257/727; 361/703
(58) Field of Search ................... 361/687, 703, 361/697, 704, 717–719; 257/718, 719, 727; 411/346, 352, 516, 520; 248/316.7, 505, 510; 174/16.3; 267/150, 158, 160; 24/473, 457, 458; 165/185

(56) References Cited

U.S. PATENT DOCUMENTS

| | | | |
|---|---|---|---|
| 5,541,811 | * | 7/1996 | Henningsson . |
| 5,594,624 | * | 1/1997 | Clemens . |
| 5,771,153 | * | 6/1998 | Sheng . |
| 5,818,695 | * | 10/1998 | Olson . |
| 5,831,829 | * | 11/1998 | Lin . |
| 5,870,288 | * | 2/1999 | Chen . |
| 5,982,620 | * | 11/1999 | Lin . |
| 6,037,660 | * | 3/2000 | Liu . |

* cited by examiner

Primary Examiner—Gerald Tolin
(74) Attorney, Agent, or Firm—Wei Te Chung

(57) ABSTRACT

A heat sink includes a thermally conductive body and at least one clip to secure the conductive body to a circuit board with a central processing unit interposed between the heat sink and the circuit board. The conductive body has a base with a flat bottom face positioned on the central processing unit and a top side on which a plurality of fins are formed. The fins are parallel with and spaced from each other to define slots therebetween which serve as air flow passages. The conductive body is made by means of extrusion whereby the fins and the base are integrated with each other as a unitary member. The clip has a U-shaped anchoring section fit into one of the slots and retained by the adjacent fins and a cantilevered arm extending from the anchoring section and having a free end. The free end has a hole for receiving a fastener to secure the clip to the circuit board. The clip is stamped to be a unitary member. Thus, the manufacture of the heat sink is greatly simplified.

8 Claims, 4 Drawing Sheets

HEAT SINK

BACKGROUND OF THE INVENTION

1. Field of the Invention

The present invention generally relates to a heat sink for removing heat from an electronic device, such as a central processing unit (CPU), and in particular to a heat sink having a simple and universal structure which is suitable for removing heat from different electronic devices.

2. The Prior Art

The operation of electronic devices, such as a central processing unit (CPU), adapted in a computer generates heat. With the significant increase in the operational speed of electronic devices, the heat generated during operation of the electronic device becomes substantial which, if not properly removed, leads to the overheating of the electronic device. A heat sink is usually attached to the electronic device to remove the heat generated thereby. There are a variety of heat sinks available in the market. FIGS. 1 and 2 of the attached drawings show two conventional heat sinks.

The heat sink 1 of FIG. 1 comprises a base 10 on which a plurality of parallel and spaced fins 14 are formed. The base 10 has two lugs 11 each forming a hole 111 for receiving a fastener 12 therein. A spring 13 is associated with each of the fasteners 12 to provide a biasing force for urging the base 10 of the heat sink 1 against an electronic device from which heat is to be removed thereby establishing a secure contact engagement therebetween. However, the formation of the lugs 11 on the base 10 not only complicates the manufacturing process of the heat sink, but also creates material waste during formation of the lugs 11.

The heat sink 20 of FIG. 2 comprises a base 25 positionable on an electronic device 2, such as a CPU, and a plurality of fins 26 formed on the base 25. A planar section 21 is machined on the base 25 among the fins 26 for receiving a resilient clip 22 which engages with sideways projections 24 of a CPU socket 23 thereby securing the heat sink 20 to the CPU 2 mounted on the CPU socket 23. Such a heat sink 20 is disclosed in U.S. Pat. No. 5,671,118. However, the formation of a planar section on the heat sink increases costs and may damage the heat sink.

It is thus desirable to have a heat sink with a simple structure for facilitating and reducing manufacturing costs.

SUMMARY OF THE INVENTION

Accordingly, an object of the present invention is to provide a heat sink having a simple and universal structure.

Another object of the present invention is to provide a heat sink having a simple structure for simplifying the manufacture thereof.

A further object of the present invention is to provide a heat sink that has a low manufacturing cost.

Yet another object of the present invention is to provide a heat sink which can be readily mounted to an electronic device from which heat is to be removed.

To achieve the above objects, a heat sink in accordance with the present invention comprises a thermally conductive body and at least one clip to secure the conductive body to a circuit board with a central processing unit interposed between the heat sink and the circuit board. The conductive body has a base with a flat bottom face positioned on the central processing unit and a top side on which a plurality of fins are formed. The fins are parallel with and spaced from each other to define slots therebetween which serve as air flow passages. The conductive body is made by means of extrusion whereby the fins and the base are integrated with each other as a unitary member. The clip has a U-shaped anchoring section fit into one of the slots and retained by the adjacent fins, and a cantilevered arm extending from the anchoring section and having a free end. The free end defines a hole for receiving a fastener to secure the clip to the circuit board. The clip is stamped to be a unitary member. Thus, the manufacture of the heat sink is greatly simplified.

BRIEF DESCRIPTION OF THE DRAWINGS

The present invention will be apparent to those skilled in the art by reading the following description of the preferred embodiments thereof, with reference to the accompanying drawings, in which.

DETAILED DESCRIPTION OF THE PREFERRED EMBODIMENTS

Figure 3:
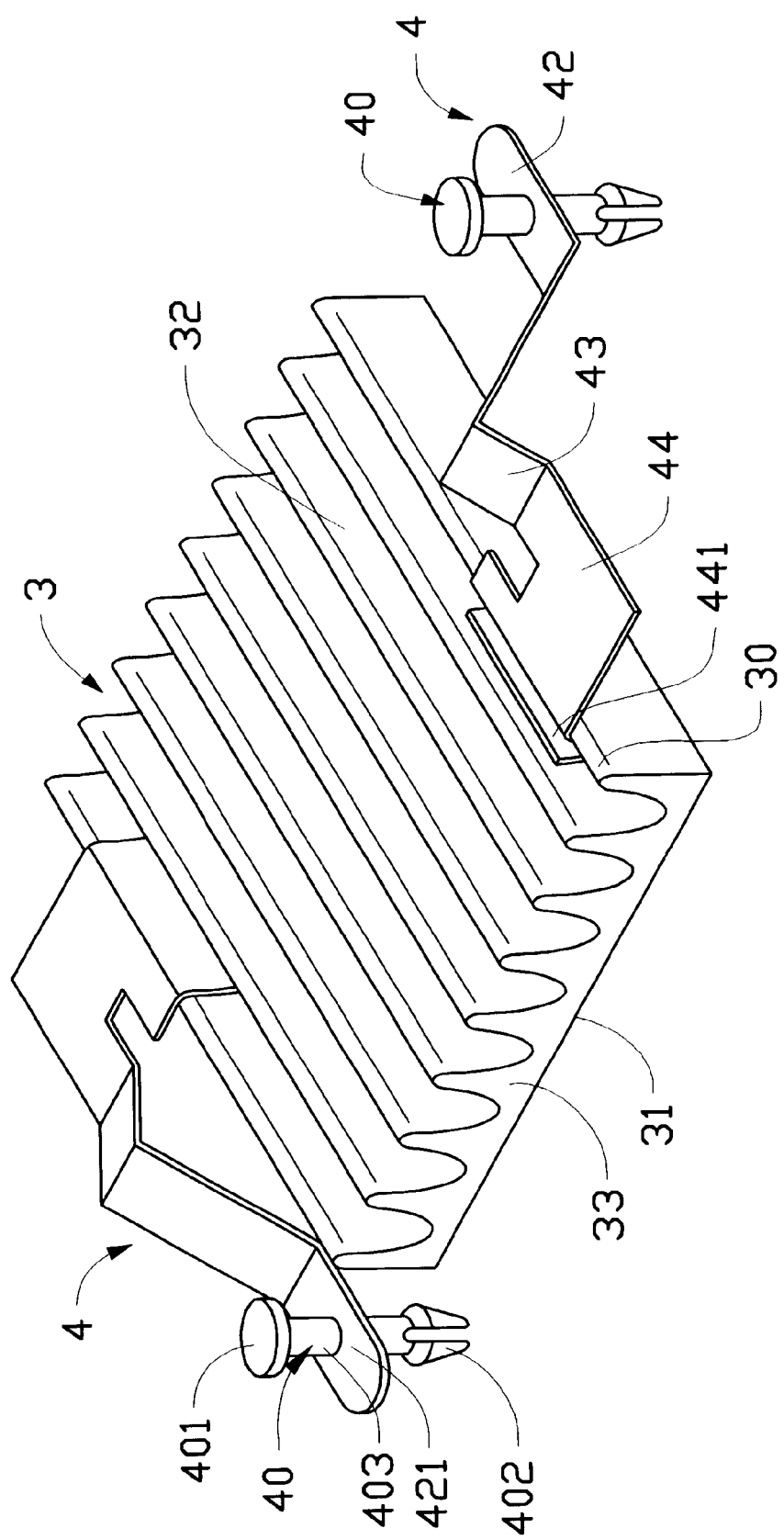
FIG. 3 is a perspective view of a heat sink in accordance with a first embodiment of the present invention.

Referring to the drawings and in particular to FIG. 3, wherein a heat sink constructed in accordance with a first embodiment of the present invention is shown, the heat sink comprises a thermally conductive body 3 having a base 33 forming a flat bottom face 31 adapted to be positioned on and physically engaged with an outer surface of an electronic device (not shown) from which heat is to be removed. The conductive body 3 also has a top face on which a plurality of fins 30 are formed. In the embodiment illustrated, the fins 30 are parallel to and spaced from each other to define a slot 32 between each pair of adjacent fins 30. The slots 32 allow air to flow therethrough for carrying heat away from the fins 30.

Figure 1:
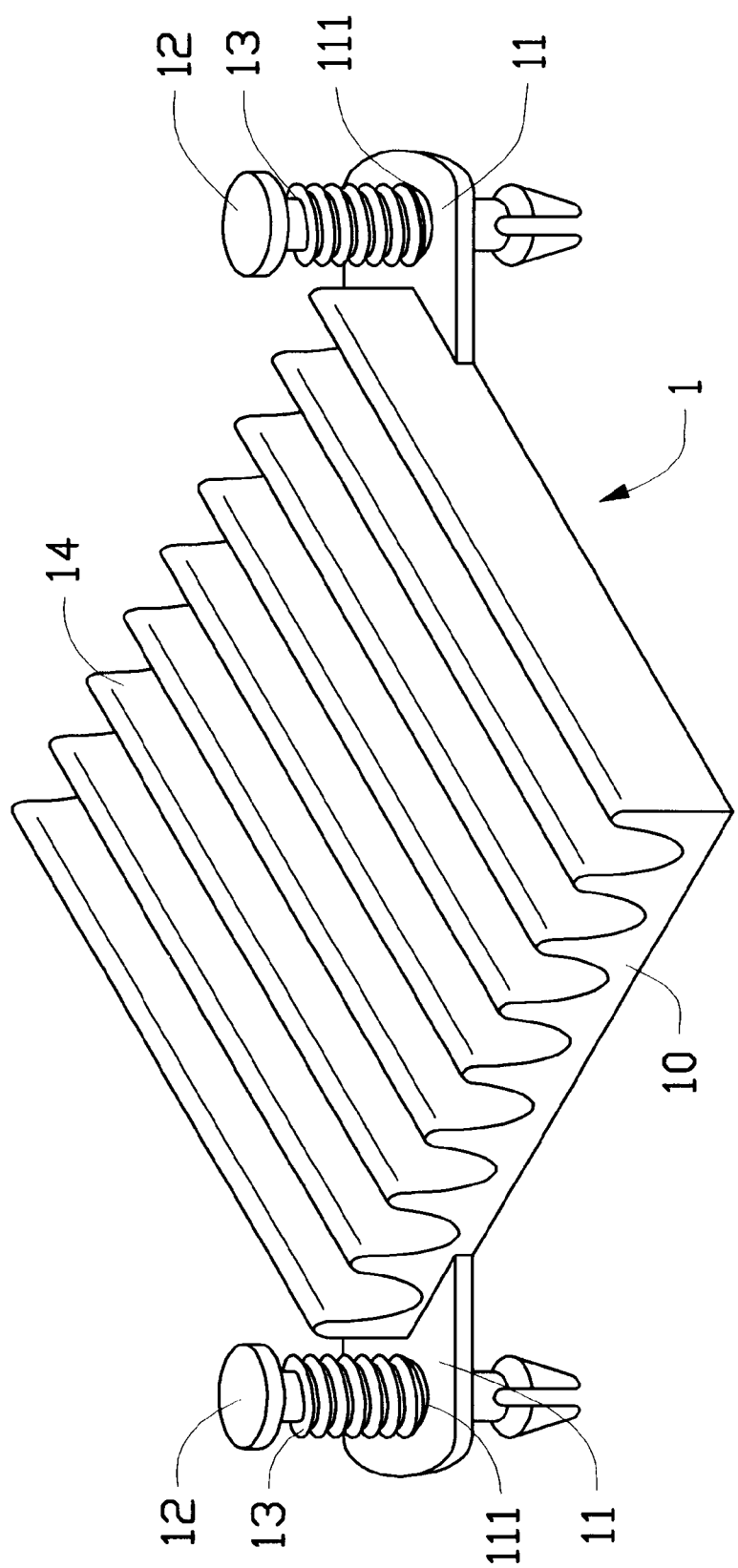
FIG. 1 is a perspective view of a conventional heat sink.
Figure 2:
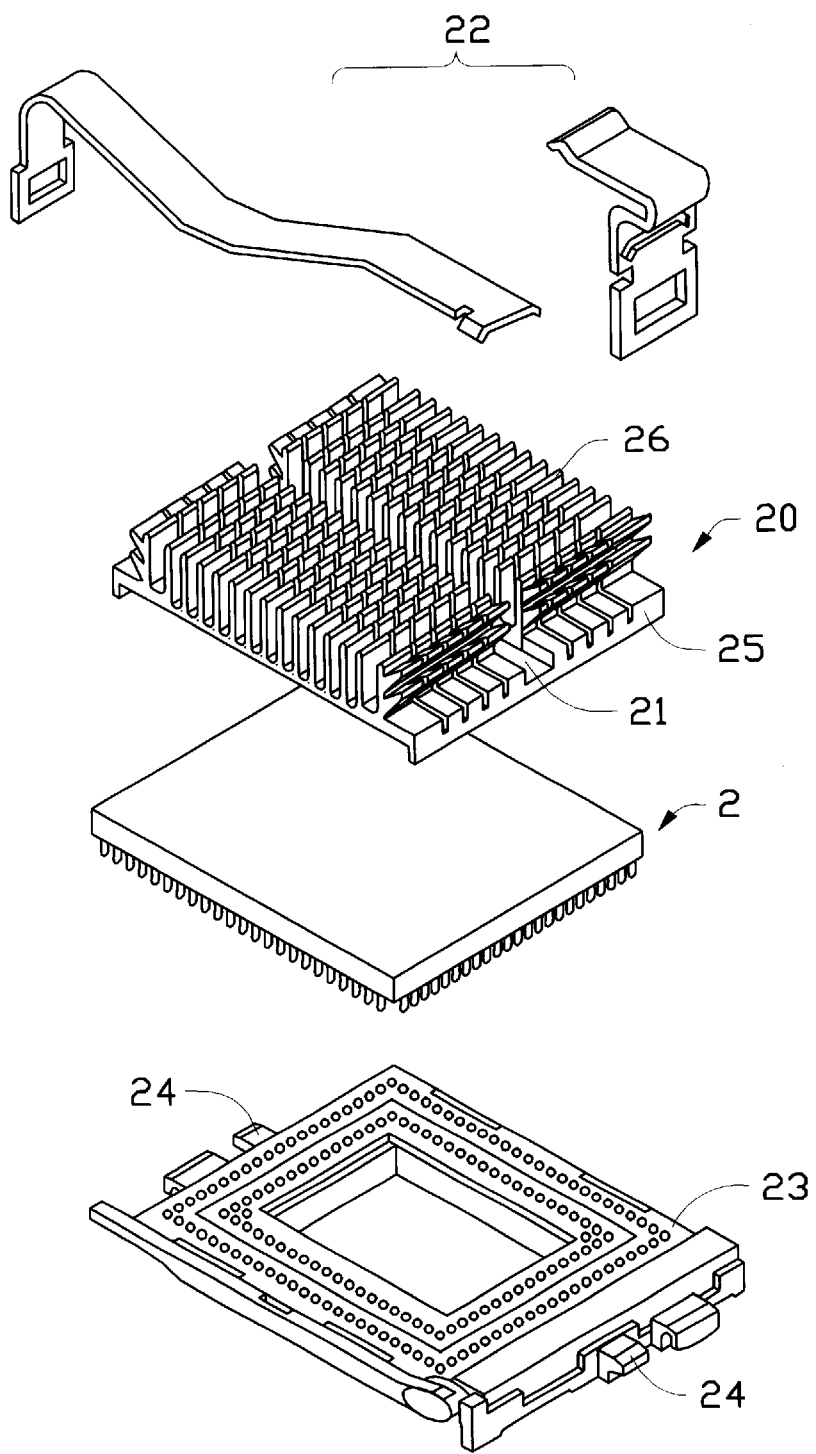
FIG. 2 is an exploded view of another conventional heat sink.

The conductive body 3 may be made of aluminum or an alloy thereof by means of extrusion. No further machining is needed when forming the conductive body 3 so that the manufacture thereof is simplified compared to the prior art shown in FIGS. 1 and 2.

The heat sink further comprises two clipping members 4. Each clipping member 4 comprises a base section 44 on which an anchoring member 441 is formed. The anchoring member 441 may have a U- or V-shaped cross section to be received in one of the slots 32. Alternatively, the anchoring member 441 may be simply an extension of the base section 44 received in the slot 32.

A cantilevered arm 43 extends from the base section 44 to support a fastener 40 at a free end 42 thereof. The fastener 40 comprises a cylindrical body 403 fit into a hole 421 formed in the free end 42 of the cantilevered arm 43. The fastener 40 has an expanded head 401 and an expanded conic end 402 which is adapted to engage a hole formed on a circuit board (not shown) thereby securing the heat sink to the circuit board.

The cantilevered arm 43 is made of a resilient material thereby providing a biasing force for securely retaining the conductive body 33 on the electronic device from which heat is to be removed. Thus, an external spring element is not needed compared to the conventional heat sink shown in FIG. 1.

The cantilevered arm 43 may comprise an arcuate section, such as the inverted V-shaped configuration shown in FIG. 3, which enhances the resiliency provided by the cantilevered arm 43.

The clipping member 4 may be made as a unitary member by means of stamping so that the manufacture thereof is significantly simplified. If desired, the free end 42 of the cantilevered arm 43 may be formed to have a conical shape that may directly engage the hole of the circuit board for securing the heat sink thereto. Thus, the need for the fasteners 4 is eliminated and the structure of the heat sink in accordance with the present invention is further simplified.

Figure 4:
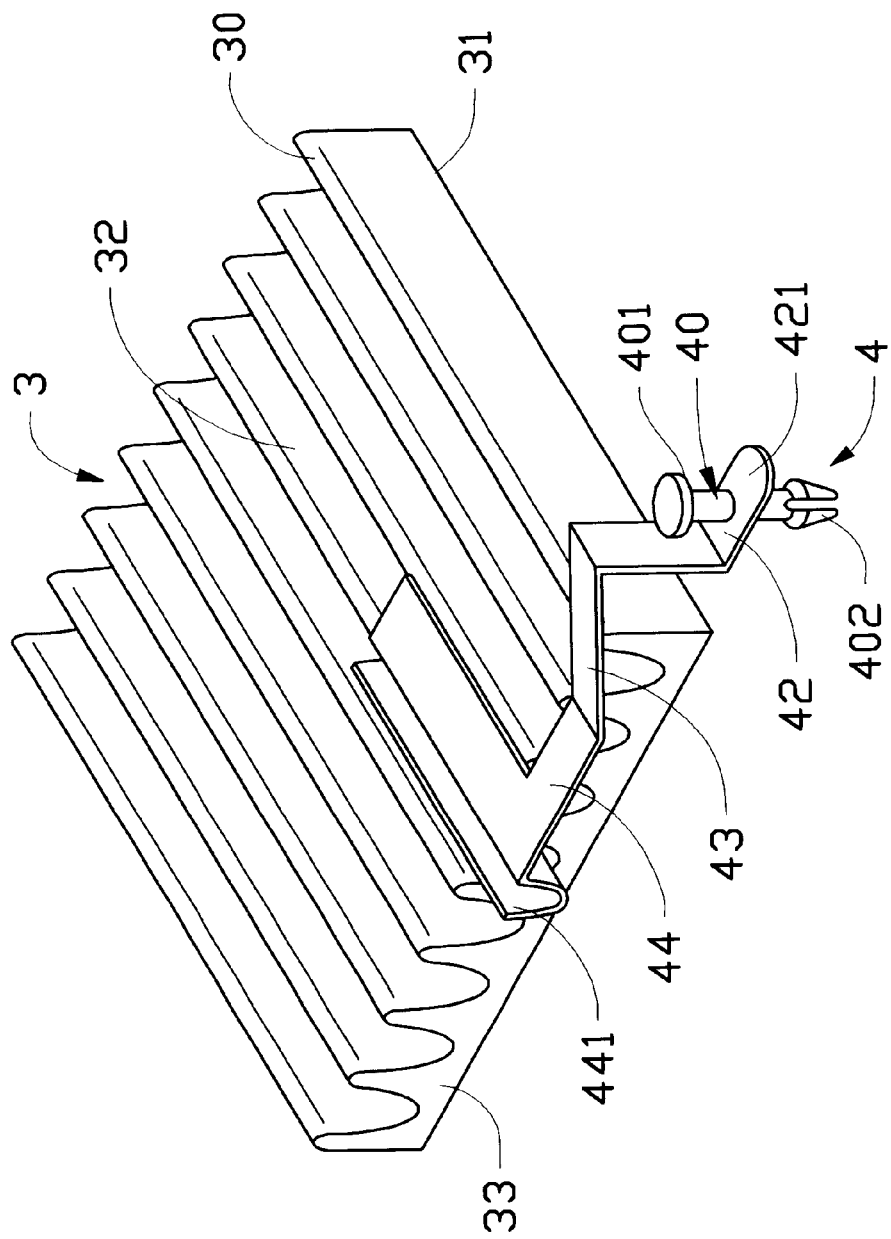
FIG. 4 is a perspective view of a heat sink in accordance with a second embodiment of the present invention.

Although it has been shown that two clipping members 4 are used to secure the heat sink to a circuit board, it is also possible to secure the heat sink with only one clipping member. In FIG. 4 which shows a second embodiment, the same parts of the heat sink are designated with the same reference numerals as that of FIG. 3 thus no further discussion is required herein. However, it should be noted that the cantilevered arm 43 of the first embodiment with reference to FIG. 3 is oriented to be substantially parallel to the fins 30, while that of the second embodiment is substantially normal to the fins 30. This difference does not affect the function of the clipping member for securing the heat sink to the circuit board while applying a biasing force on the conductive body.

Although the present invention has been described with reference to the preferred embodiments thereof, it is apparent to those skilled in the art that there are a variety of modifications and changes that may be made without departing from the scope of the present invention which is intended to be defined by the appended claims.

What is claimed is:

1. A heat sink adapted to be positioned on and in contact engagement with an electronic device mounted on an external member for removing heat therefrom comprising:

a thermally conductive body having a base defining a bottom face positionable on the electronic device and a top face from which a plurality of fins extends, the fins being parallel to and spaced from each other to define therebetween a plurality of slots forming air flow passage; and a pair of clipping members each having a base section pressing on a top of one fin, an anchoring section received in one of the slots adjacent the one fin, a resilient cantilevered arm extending from the base section, and a fastener secured to a free end of the cantilevered arm for securing the heat sink to the external members thereby attaching the heat sink to the electronic device.

2. The heat sink as claimed in claim 1, wherein the conductive body is formed to be a unitary member by means of extrusion.

3. The heat sink as claimed in claim 1, wherein the anchoring section comprises a U-shaped configuration fitting into the slot for being retained between a pair of adjacent fins.

4. The heat sink as claimed in claim 1, wherein the cantilevered arm comprises a bending section to enhance the resiliency thereof.

5. The heat sink as claimed in claim 4, wherein the bending section of the cantilevered arm has an inverted V-shape.

6. The heat sink as claimed in claim 1, wherein the fastener is received in a hole formed in the free end of the cantilevered arm.

7. The heat sink as claimed in claim 6, wherein the fastener comprises a cylindrical body fitting into the hole of the cantilevered arm.

8. The heat sink as claimed in claim 1, wherein the fastener comprises an expanded conic end for engaging the hole defined in the external member.

\* \* \* \* \*